(12) United States Patent
Bhunia et al.

(10) Patent No.: US 11,797,736 B2
(45) Date of Patent: Oct. 24, 2023

(54) SARO: SCALABLE ATTACK-RESISTANT OBFUSCATION OF LOGIC CIRCUITS

(71) Applicant: University of Florida Research Foundation, Incorporated, Gainesville, FL (US)

(72) Inventors: Swarup Bhunia, Gainesville, FL (US); Abdulrahman Alaql, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 147 days.

(21) Appl. No.: 17/443,815

(22) Filed: Jul. 27, 2021

(65) Prior Publication Data

US 2022/0035977 A1 Feb. 3, 2022

Related U.S. Application Data

(60) Provisional application No. 63/059,299, filed on Jul. 31, 2020.

(51) Int. Cl.
*G06F 30/398* (2020.01)
*G06F 30/327* (2020.01)
(Continued)

(52) U.S. Cl.
CPC .......... *G06F 30/327* (2020.01); *G06F 30/337* (2020.01); *G06F 30/392* (2020.01); *G06F 30/398* (2020.01)

(58) Field of Classification Search
CPC ...... G06F 30/30; G06F 30/392; G06F 30/327; G06F 30/33; G06F 2115/08;
(Continued)

(56) References Cited

U.S. PATENT DOCUMENTS

| | | | |
|---|---|---|---|
| 2019/0034574 A1* | 1/2019 | Zhu | G06F 30/392 |
| 2019/0311156 A1* | 10/2019 | Tehranipoor | G06F 30/394 |
| 2020/0065456 A1* | 2/2020 | Tehranipoor | G06F 21/14 |

OTHER PUBLICATIONS

Shamsi, Kaveh et al. *AppSAT: Approximately Deobfuscating Integrated Circuits*, In 2017 IEEE International Symposium on Hardware Oriented Security and Trust (HOST), May 1, 2017, pp. 95-100, IEEE, DOI: 10.1109/HST.2017.7951805.

(Continued)

*Primary Examiner* — Binh C Tat
(74) *Attorney, Agent, or Firm* — ALSTON & BIRD LLP

(57) ABSTRACT

A method of obfuscating a circuit design includes, in part, receiving a netlist of the circuit design, splitting the circuit design into a multitude of partitions, transforming each partitions so as to obfuscate each partition, and stitching the multitude of transformed partitions to form the obfuscated circuit. The netlist may be a register transfer level netlist. The number and the size of partitions may vary. The partitions may be distributed throughout the entirety of the design. The method may further include generating a randomized circuit associated with at least a subset of the partitions, and merging each partition with the partition's associated randomized circuit. The method may further include quantifying the amount of transformation associated with each partition. The method may further include adding a first key to at least one of the obfuscated partitions, and adding a second key to the partition's associated randomized circuit.

24 Claims, 15 Drawing Sheets

(51) Int. Cl.
*G06F 30/392* (2020.01)
*G06F 30/337* (2020.01)

(58) Field of Classification Search
CPC .............. G06F 30/398; G06F 2119/12; G06F 30/3312; G06F 30/36; G06F 16/51; G06F 2111/20; G06F 30/39; G06F 12/0811; G06F 12/0815; G06F 12/0888; G06F 15/7821; G06F 15/7867; G06F 16/9032; G06F 16/90335; G06F 9/30036; G06F 9/30145; G06F 9/3836; G06F 2111/12; G06F 30/337; G06F 30/394; G06F 13/16; G06F 13/4068; G06F 13/4265; G06F 30/3308; G06F 12/1408; G06F 21/445; G06F 21/57; G06F 21/606; G06F 21/72; G06F 21/73; G06F 21/85; G06F 2119/06; G06F 2221/2103; G06F 30/333; G06F 21/608; G06F 2207/4824; G06F 7/5443; G03F 1/36; G03F 1/44; G03F 1/70; G03F 1/78; H01L 27/0207; H01L 21/76886; H01L 23/528; H01L 2027/11883; H01L 21/768
USPC .................................. 716/100–108
See application file for complete search history.

(56) References Cited

OTHER PUBLICATIONS

Sülflow, André et al. *Evaluation of SAT Like Proof Techniques For Formal Verification of Word Level Circuits*, in IEEE Workshop on RTL and High Level Testing, Oct. 2007, pp. 31-36.

Kamali, Hadi Mardani et al. *Full-Lock: Hard Distributions Of SAT Instances For Obfuscating Circuits Using Fully Configurable Logic and Routing Blocks*, In Proceedings of the 56th Annual Design Automation Conference 2019, Jun. 2, 2019, pp. 1-6, DOI: 10.1145/3316781.3317831.

Mitchell, David et al. *Hard and Easy Distributions of SAT Problems*, In Proceedings of the Tenth National Conference On Artificial Intelligence AAAI-92, vol. 92, Jul. 12, 1992, pp. 459-465.

Chakraborty, Rajat Subhra et al. *Hardware Protection and Authentication Through Netlist Level Obfuscation*, In Proceedings of the 2008 IEEE/ACM International Conference on Computer-Aided Design, IEEE Press, Nov. 10, 2008, pp. 674-677, DOI: 10.1109/ICCAD.2008.4681649.

Lee, Yu-Wei et al. *Improving Logic Obfuscation Via Logic Cone Analysis*, In 2015 16th Latin-American Test Symposium (LATS). IEEE, Mar. 25, 2015, pp. 1-6, DOI: 10.1109/LATW.2015.7102410.

Xie, Yang et al. *Mitigating SAT Attack On Logic Locking*, In International Conference on Cryptographic Hardware and Embedded Systems. Springer, Aug. 4, 2016, pp. 127-146, DOI: 10.1007/978-3-662-53140-2_7.

Karypis, George et al. *Multilevel Hypergraph Partitioning: Applications In VLSI Domain*, IEEE Transactions on Very Large Scale Integration (VLSI) Systems, vol. 7, No. 1, pp. 69-79, Mar. 1999, DOI: 10.1109/92.748202.

Yasin, Muhammad et al. *Provably-Secure Logic Locking: From Theory To Practice*, In Proceedings of the 2017 ACM SIGSAC Conference on Computer and Communications Security, Oct. 30, 2017, pp. 1601-1618, DOI: 10.1145/3133956.3133985.

Yasin, Muhammad et al. *SARLock: SAT Attack Resistant Logic Locking*, In 2016 IEEE International Symposium on Hardware Oriented Security and Trust (HOST). IEEE, May 3, 2016, pp. 236-241, DOI: 10.1109/HST.2016.7495588.

* cited by examiner

Algorithm Scalable Attack Resistant Obfuscation

1: procedure SARO
2: Input: $org\_netlist$: Design netlist to be obfuscated
3: Input: $k_{size}$: Size of the obfuscation key
4: Input: $aig\_flag$: AIG flag
5: Input: $RanSAT\_limit$: Number of RanSAT insertions
6:    $RanSAT\_count \leftarrow 0$
7:    $G_{org} \leftarrow Hyper\_Graph\_Converter(org\_netlist)$
8:    $partition\_size \leftarrow initial\_analysis(G_{org}, k_{size})$
9:    if $aig\_flag$ then
10:      $G_{org} = AIG(G_{org})$                                                                    ▷ optional
11:    $G_{org}[p] = partition(G_{org}, partition\_size)$
12:    $shuffle(G_{org}[p])$
13:    for $partition$ in $G_{org}[p]$
14:      if $RanSAT\_count \leq RanSAT\_limit$ then
15:         $SARO\_netlist[p] = RanSAT(partition)$
16:         $RanSAT\_count = RanSAT\_count + 1$
17:      else
18:         $SARO\_netlist[p] = SARO\_lock(partition)$
19:      end if
20:    end for
21:    $locked\_netlist = merge(SARO\_netlist[p])$
22: Output: $locked\_netlist$: Obfuscated netlist
23: end procedure

Fig. 4

```
Algorithm   Random SAT-Hard Function Generator
 1: procedure RanSAT
 2: Input: partition: Sub-circuit to match RanSAT function
 3:   $RanSAT_{graph} \leftarrow \{\}$
 4:   $Depth_{partition} \leftarrow measure\_levels(partition)$
 5:   $Depth_{RanSAT} = Depth_{partition} + rand[-2,-1,0,1,2]$
 6:   $Width_{partition} \leftarrow measure\_logic\_cone(partition)$
 7:   $Width_{RanSAT} = Width_{partition} + rand[-2,-1,0,1,2]$
 8:   for $logic\_level = 1$ to $Depth_{RanSAT}$
 9:       obtain $CV_{initial}$                              ▷ CNF clause to variable ratio
10:       $Width_{RanSAT} \leftarrow width\_adjust(CV_{initial})$
11:       $RanSAT_{level} \leftarrow gates\_select(gates\_list, CV_{initial})$
12:       obtain $CV$                                        ▷ CNF clause to variable ratio
13:       if $CV$ is between 3.5 and 5 then
14:           $RanSAT_{graph} \leftarrow permute(RanSAT_{level})$
15:           $logic\_level = logic\_level + 1$
16:       end if
17:   end for
18:   $RanSAT_{partition} \leftarrow stitch(partition, RanSAT_{graph})$
19:   return $Partition_{obf}$
20: end procedure
```

Fig. 9

Stripped-Functionality Locking (SFLL)

Full-Lock

Cone-Size Based Locking (CS)

SARO (Proposed)

SARO: SCALABLE ATTACK-RESISTANT OBFUSCATION OF LOGIC CIRCUITS

RELATED APPLICATION

The present application claims benefit under 35 USC 119(e) of U.S. Patent Application No. 63/059,299, filed Jul. 31, 2020, the content of which is incorporated herein by reference in its entirety.

TECHNICAL FIELD

The present application relates to integrated circuits, and more particularly to an integrated circuit that is obfuscated to be resistant to attacks.

BACKGROUND

Hardware IPs are commonly employed in the semiconductor industry. A single System-on-Chip (SoC) generally includes one or more third-party hardware Intellectual Property (IP) cores. A hardware IP core typically includes a Register Transfer Level (RTL) source code and/or gate-level netlists. However, hardware IP cores are generally vulnerable to security attacks such as IP piracy, counterfeiting, reverse engineering, and the like. A technique such as, for example, an authentication technique or an obfuscation technique, can be employed to provide IP protection. Authentication techniques generally rely on insertion of a unique signature (e.g., watermark) to establish ownership of a hardware IP core. Obfuscation techniques, on the other hand, generally rely on preventing an attacker from black-box usage of a hardware IP core and/or understanding a design-intent of a hardware IP core, thereby preventing an unauthorized third-party from gaining access to the hardware IP core or replicating a design of the hardware IP core.

BRIEF SUMMARY

A method of obfuscating a circuit design, in accordance with one embodiment of present disclosure, includes, in part, receiving a netlist of the circuit design, splitting the circuit design into a multitude of partitions, transforming each of the multitude of partitions thereby to obfuscate each partition, and stitching the multitude of transformed partitions to form the obfuscated circuit.

In one embodiment, the method further includes, in part, shuffling the transformed partitions. In one embodiment, the netlist is a register transfer level netlist. In one embodiment, the method further includes, in part varying the number of the partitions. In one embodiment, the method further includes, in part, varying the size of at least a subset of the partitions. In one embodiment, the partitions are distributed throughout the entirety of the design.

In one embodiment, the method further includes, in part, generating a randomized circuit associated with at least a subset of each of the multitude of partitions, and merging each partition with the partition's associated randomized circuit. Each randomized circuit substantially matches the shape and size of its associated partition. In one embodiment, the method further includes, in part, merging each partition with the partition's associated randomized circuit via a multitude of multiplexers each adapted to receive a different key at the multiplexer's select terminal.

In one embodiment, the method further includes, in part quantifying the amount of transformation associated with each partition. In one embodiment, the method further includes, in part, randomizing the number of outputs obfuscated in each partition. In one embodiment, the method further includes, in part randomizing the location in each partition at which an obfuscation key is applied.

In one embodiment, the method further includes, in part, randomly selecting in each partition one or more logic gates used to obfuscate the partition. In one embodiment, the method further includes, in part, adding a first key to at least one of the obfuscated partitions, and adding a second key to the partition's associated randomized circuit. In one embodiment, the method further includes, in part, including configurable logic to enable updating of the first and second keys during various stages of development of the design.

A system, in accordance with one embodiment of the present disclosure, includes, in part, a memory storing instructions, and a processor, coupled with the memory and configured to execute the instructions. The instructions when executed cause the processor to receive a netlist of the circuit design, split the circuit design into a multitude of partitions, transform each of the plurality of partition thereby to obfuscate each partition, and stitch the plurality of transformed partitions to form the obfuscated circuit.

In one embodiment, the instructions further cause the processor to shuffle the transformed partitions. In one embodiment, the netlist is a register transfer level netlist. In one embodiment, the instructions further cause the processor to vary the number of partitions. In one embodiment, the instructions further cause the processor to vary the sizes of at least a subset of the partitions. In one embodiment, the partitions are distributed throughout an entirety of the design.

In one embodiment, the instructions further cause the processor to generate a randomized circuit associated with at least a subset of each of the plurality of partitions, and merge each partition with the partition's associated randomized circuit. Each randomized circuit substantially matches the shape and size of its associate partition. In one embodiment, the instructions further cause the processor to merge each partition with the partition's associated randomized circuit via a multitude of multiplexers each adapted to receive a different key at the multiplexer's select terminal.

In one embodiment, the instructions further cause the processor to quantify the amount of transformation associated with each partition. In one embodiment, the instructions further cause the processor to randomize a number of outputs obfuscated in each partition. In one embodiment, the instructions further cause the processor to randomize the location in each partition at which an obfuscation key is applied. In one embodiment, the instructions further cause the processor to randomly select in each partition one or more logic gates used to obfuscate the partition. In one embodiment, the instructions further cause the processor to add a first key to at least one of the obfuscated partitions, and add a second key to the partition's associated randomized circuit. In one embodiment, the instructions further cause the processor to include configurable logic to enable updating of the first and second keys during various stages of development of the design.

BRIEF DESCRIPTION OF THE DRAWINGS

FIG. 4 shows an algorithm adapted to provide for scalable attack resistant obfuscation, in accordance with one embodiment of the present disclosure.

FIG. 9 is an exemplary algorithm that provides a random SAT function generator, in accordance with one embodiment of the present disclosure.

DETAILED DESCRIPTION

Figures 1A, 1B:
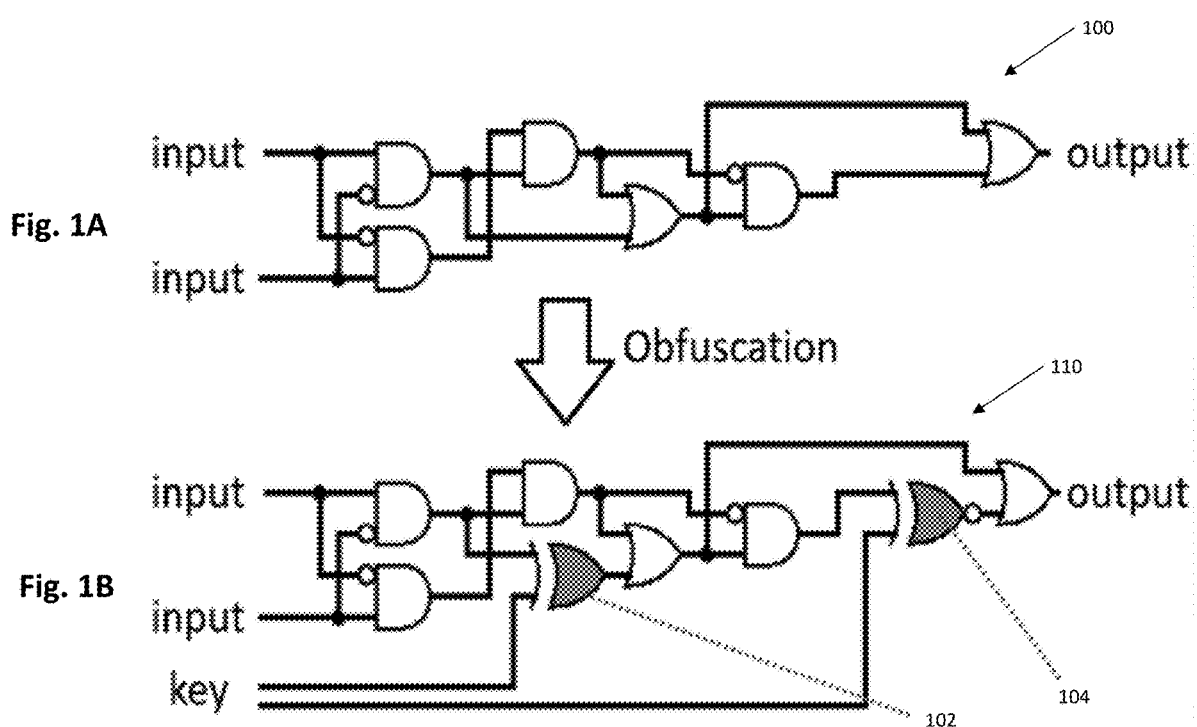
FIG. 1A shows a logic circuit, as known in the prior art.
FIG. 1B shows the logic circuit of FIG. 1A after the circuit has been obfuscated.

The present disclosure more fully describes various embodiments with reference to the accompanying drawings. It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

Hardware obfuscation is a technique that protects hardware IP cores against piracy attacks and/or other security vulnerabilities. An obfuscation technique may be used during early stages of a life cycle of a hardware IP core to frustrate an attacker. For example, functional obfuscation techniques (e.g., logic locking techniques) are applied to Register-Transfer Level (RTL) or gate-level netlists. Other obfuscation techniques (e.g., a physical obfuscation technique, etc.) are applied during the fabrication stage of a hardware IP core. For example, physical obfuscation techniques are post-silicon measures that are applied to a basic structure of logic elements of an integrated circuit. By adding dummy contacts, the logic elements are not easily distinguishable, thereby adding a layer of protection against physical attacks.

Conventional obfuscation techniques that employ deterministic techniques, remain vulnerable to piracy attacks and/or other security vulnerabilities due to, for example, the deterministic techniques being uncovered and/or bypassed by an attacker. Additionally, existing countermeasures generally suffer from a lack of robust graphical alteration of a target integrated circuit, which provides an attacker with an opportunity to perform structural-based attacks. Moreover, the ability of these techniques to successfully obfuscate a large-scale design also limits their practical applications.

To overcome these shortcomings, various embodiments described herein provide scalable attack-resistant obfuscation of logic circuits. Accordingly, functional-based attacks and/or structural analysis-based attacks on obfuscated circuits are minimized by employing various techniques disclosed herein. In one embodiment, a target circuit (e.g., an integrated circuit) may be represented as a graph and partitioned using an algorithm. Furthermore, a robust and randomized design transformation process may be performed with respect to each partition individually. Each partition may then be obfuscated individually. The scalable attack-resistant obfuscation may be a pre-silicon structural and/or functional hardware logic obfuscation where the circuit design is divided into a multitude of small partitions.

In accordance with one embodiment of the present disclosure, a circuit is structurally altered. In one embodiment, the ability to lock a relatively large hardware IP cores is provided. The scalable attack-resistant obfuscation can perform a high-level RTL design transformation that provides a multitude of locking mechanisms. In one embodiment, the scalable attack-resistant obfuscation can add key dependency to both original gates as well as to added gates to form a symmetric partition with hard-to-find dummy functions. In one embodiment, the scalable attack-resistant obfuscation can provide a well-hidden and/or a hard-to-remove distributed protection against various attacks on logic obfuscation. In one embodiment, the scalable attack-resistant obfuscation provides a tool that generates random and unrecognizable satisfiability (SAT)-hard functions to be used to mitigate SAT-based attacks. In one embodiment, the scalable attack-resistant obfuscation provides a pre-silicon obfuscation evaluation metric that can quantify the level of structural and/or functional alteration caused by the obfuscation process.

In one embodiment, the integrated circuit design is divided into a number of partitions. A randomized design transformation for each output function of one or more partitions from the multitude of partitions can be performed to generate a set of obfuscated partitions for the integrated circuit. In one embodiment, functional transformations and/or structural transformations can be evenly distributed across the entirety of the design of the integrated circuit. In one embodiment, a key-dependent transformation of Boolean functions can be incorporated in a partition in a way that, unlike existing logic locking approaches, does not employ key gate insertion. In another embodiment, re-configurable logic can be employed to provide for updating the locking key value at different IP development stages and/or from chip to chip using a set of programmable configuration bits. The attack-resistant obfuscated circuit may be provided based on the set of obfuscated partitions.

As used herein, the term 'obfuscation' may be used interchangeably to represent electronic hardware obfuscation or logic locking techniques. Furthermore, as used herein, a netlist can be a description of connectivity for a circuit. For example, a netlist can be formatted in a hardware description language to describe connectivity for a circuit. Furthermore, as used herein, RTL source code can model a circuit based on flow of signals between hardware components and/or logical operations associated with the signals. For example, a hardware description language may be used to implement RTL source code associated with an integrated circuit design.

As described above, in accordance with one aspect of the present disclosure, an integrated circuit design is split into multiple partitions. Each partition is then obfuscated separately using an obfuscation scheme. In one embodiment, a design transformation process related to the obfuscation may be an RTL-based locking mechanism implemented to be randomized in one or more aspects. FIG. 1A shows a logic circuit 100. FIG. 1B shows circuit 110 that is similar to circuit 100 except that circuit 110 has been obfuscated to include an XOR gate 102 and an XNOR gate 104, as shown.

Figure 2:
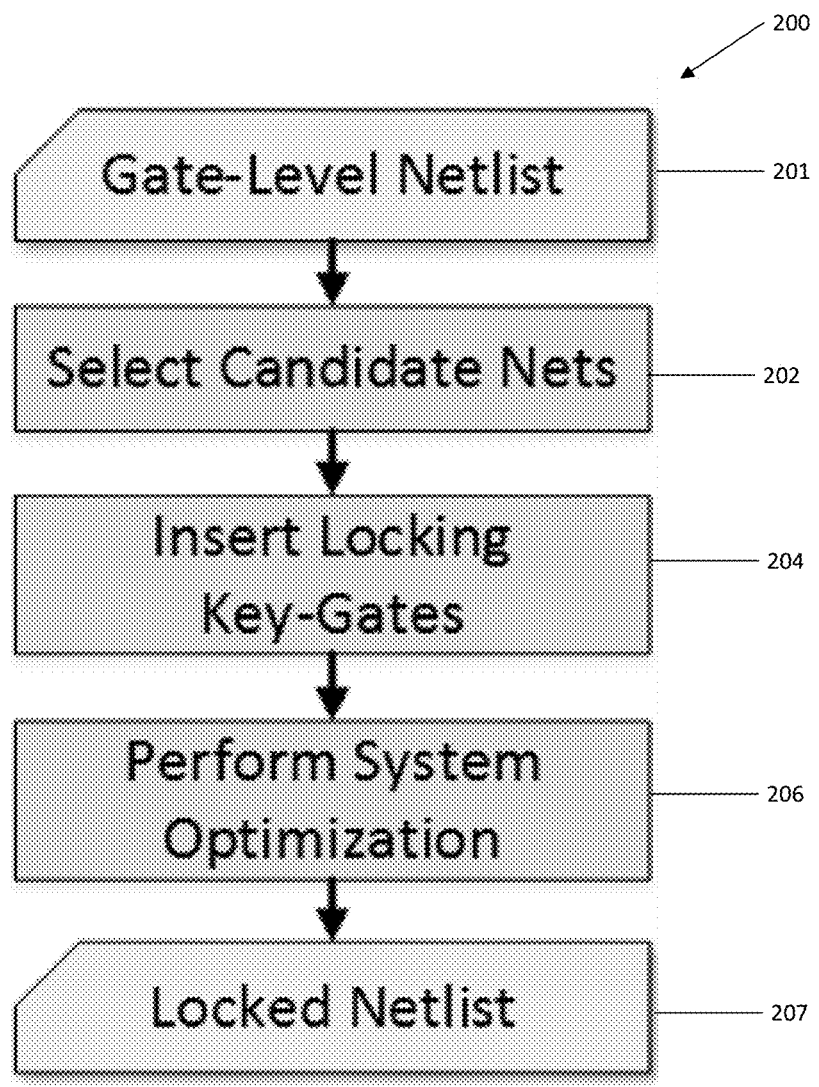
FIG. 2 is an exemplary flowchart for locking a circuit design, in accordance with one embodiment of the present disclosure.

FIG. 2 is an exemplary flowchart 200 for locking a netlist associated with a circuit design, in accordance with one embodiment of the present disclosure. At 201 a gate-level netlist is received. At 202, candidate nets from gate-level netlist 201 are selected. At f10, locking key gate are inserted into the selected netes. At 206, a system optimization is performed subsequent to which, at 207, the netlist is locked.

Figure 3:
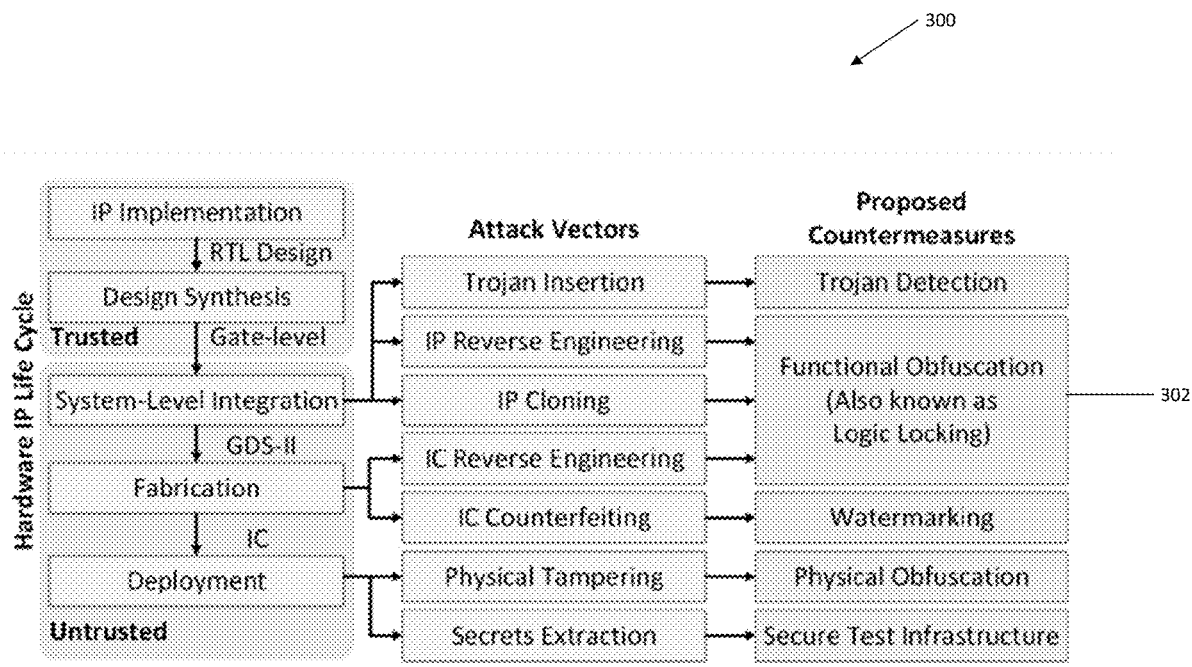
FIG. 3 shows the lifecycle of a hardware IP, the attacks it is vulnerable to during various stages, and the countermeasures that may be deployed to thwart each such attack.

FIG. 3 shows the lifecycle of a hardware IP, the attacks it is vulnerable to during various stages, and the countermeasures that may be deployed to thwart each such attack. As shown, untrusted parties may perform different malicious activities on a hardware IP during different phases of the IP's lifecycle. A scalable attack-resistant obfuscation (also referred to herein as logic locking) technique 302, in accordance with one aspect of the present disclosure, may be used to prevent IP reveres engineering, IP cloning, and IC reverse engineering attacks.

A scalable attack-resistant obfuscation technique, in accordance with an embodiment of the present disclosure, may be used to alter a structure of the netlist and/or a graphical representation of the overall design when applied to all the design partitions. The size and/or the number of partitions, as well as the design transformation associated with each partition may vary. In one embodiment, the scalable attack-resistant obfuscation can provide a highly randomized design transformation that partitions the target circuit and locks each partition individually. As such, a highly effective structural alteration of the circuit may be obtained. In one embodiment, the scalable attack-resistant obfuscation controls the power and area overheads by controlling the size of each partition and/or the total number of dummy functions inserted into the design.

FIG. 4 shows an algorithm 400 that generates a scalable attack-resistant obfuscation, according to one embodiment of the present disclosure. The inputs to the algorithm are the original netlist represented by parameter netlist_org, the size of the obfuscation key represented by parameter $k_{size}$, and overhead constraints, such as area, power, and timing, as represented by parameter RanSAT_limit, which defines the number of RanSAT insertions. The original netlist netlist_org of the target circuit is converted to an equivalent netlist $G_{org}$. Then, a partitioning algorithm, shown as $G_{org}[p]$=partition($G_{org}$,p), in which p is the number of partitions, is applied. Each design partition defined by $G_{org}[p]$ is obfuscated individually using a transformation scheme. Each step in algorithm 400 is designed to be highly randomized. For instance, after the partitioning is performed, a shuffling step (shown in line 12 of the Algorithm) is applied to randomize the design to ensure that the design transformation is non-deterministic.

A scalable attack-resistant obfuscation (SARO) process, in accordance with some embodiments, includes initial analysis and/or determination of the partition size. In the initial analysis stage, an original netlist may be compiled using a synthesis tool. Furthermore, according to some embodiments, the generated gate-level netlist may be recompiled multiple times for further optimization. The optimized netlist, defined by parameter, org netlist, can be considered the reference design, where area, power, and timing reports can be used to measure the overheads associated with the obfuscated netlist. Moreover, the size of the partitions can be specified based on the size of the circuit and/or a number of key-bits. In one embodiment, a partition size can be calculated using the following expression:

$$\text{partition\_size} = \text{round\_down}\left(\frac{Gates_{total}}{k_{size}}\right)$$

In the above expression, parameter $Gates_{total}$ represents the total number of gates (e.g., vertices), parameter $k_{size}$ represents the key size in bits, and parameter partition size represents the number of gates specified for each partition.

In some embodiment, the SARO process includes an optional step of universal gate transformation. In such embodiments, the design can be transformed into a corresponding equivalent form that includes AND gates and inverters. In one embodiment, the corresponding equivalent design may be an And-Inverter Graph (AIG). As such, SARO provides an ability to transform a design to one or more parts of the design that may not be accessible with traditional libraries.

A SARO process, in some embodiments, includes hypergraph partitioning. For example, the gate-level netlist may be transformed into an equivalent hypergraph format. A hypergraph is a generalization of a graph in which a structure is represented with vertices and edges. Vertices can represent the basic elements (e.g., gates) in the hypergraph and the edges can be the links (e.g., wires) that connect the vertices. Hyperedges may refer to edges that connect more than two vertices. Each gate and wire can be assigned a numerical value. Furthermore, the gates can be added to the vertices list, and wires can be added to the edges list. An output of such may be a hypergraph format file $G_{org}$, as shown in the netlist of FIG. 4.

In some embodiments, the hypergraph file may be run through the partitioning process. The partitioning algorithm may be a hMETIS hypergraph partitioning framework that generates high-quality partitions. In some embodiments, the number of cut edges, that are the outputs of each partition, may be reduced.

In some embodiments, the partitioning may be performed using a multi-level partitioning algorithm. For example, the multi-level partitioning algorithm may include a coarsening phase, an initial partitioning phase, an uncoarsening phase, and/or a refinement phase. During the coarsening phase, the main hypergraph can be split into a set of smaller subgraphs. The coarsening phase may be applied to balance a number of hyperedges in each generated hypergraph.

During the initial partitioning phase, the bisection of the coarsened hypergraphs generated in the coarsening phase can be computed. Since the coarsened hypergraphs are relatively small (e.g., about 100 vertices each), the partitioning algorithm can improve the runtime and/or quality of partitions. In some embodiments, during the uncoarsening phase, the partitions of the initial partitioning phase can be employed to reconstruct the main hypergraph. The partitions can correspond to the vertices of a higher-level graph, in various embodiments. During the refinement phase, the partitions for the main hypergraph can be created. By employing the refinement phase, a number of cuts in the main partitions can be reduced. Furthermore, a final list of partitions and/or corresponding vertices can be generated by the refinement phase.

In some embodiments, the parameters for the partitioning can be set based on the overhead constraints associated with the average number of gates in each partition. A file associated with the partitioned hypergraph is represented by $G_{org}[p]$ in FIG. 4. Each line in a file associated with the partitioned hypergraph can represent a vertex. Furthermore, a value in respective lines may be used to refer to the partition number which the corresponding vertex is assigned to. Each partition in the gate-level representation can be reconstructed. Furthermore, the gates, inputs, wires, and/or outputs for each partition can be identified. In some embodiments, each partition may represent a standalone design module. In some embodiments, distributed SAT attack resistance is provided. For instance, in some embodiments, a layer of protection against SAT attacks is provided. The SAT protection can be distributed to make it hard to identify and/or remove.

Figure 5:
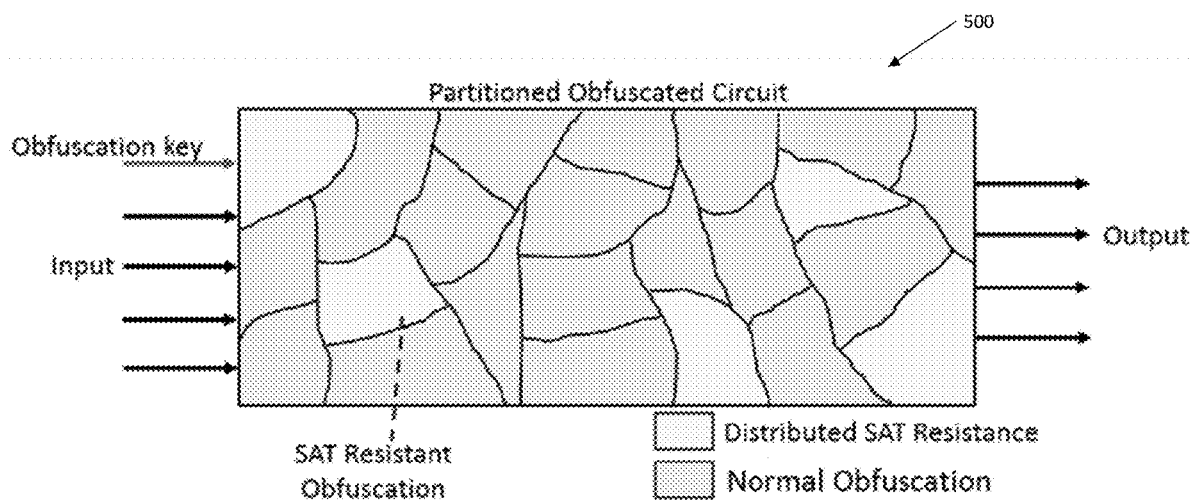
FIG. 5 shows an exemplary partitioned circuit that has distributed protection against an SAT attack, in accordance with one embodiment of the present disclosure

FIG. 5 illustrates an exemplary partitioned view 500 of a circuit that provides distributed protection against an SAT attack. For example, existing SAT mitigating techniques focus on increasing the number of distinguishable input patterns (DIPs) required to break the circuit, which increases the complexity of the attack algorithm. In accordance with embodiments of the present disclosure, complex formulas that SAT solvers are not able to break in a short time are provided.

In some embodiments, a distributed SAT resistance may be achieved by inserting SAT-hard functions into the original design of the circuit. One method to measure the SAT complexity of such functions is to analyze the conjunctive normal form (CNF). CNFs are a set of clauses that represent the functionality using only "AND" operators, "OR" operators, and variables that represent the inputs/outputs and internal signals of the circuit. A SAT-hard function can be defined as a function that has two main properties. The first property is that the clause to variable ratio for the 3-SAT CNFs (CNFs that are limited to 3 literals per clause) is approximately 4.3. The second property is that the total number of variables is as high as possible. The number of SAT-solver calls grows exponentially as the number of variables increases.

In some embodiments, a Random SAT-hard (RanSAT) function generator is used to generate a RanSAT function. The RanSAT function provides randomized SAT complex circuits that match the shape and/or size of the target partition. After the RanSAT function is generated, both the function and the original partition can be merged using, e.g., 2-input multiplexers. Additionally, the key-controlled multiplexers may be inserted at each output of the partition. In one embodiment, the corresponding output from an RanSAT function may be used as a dummy function.

Figure 6:
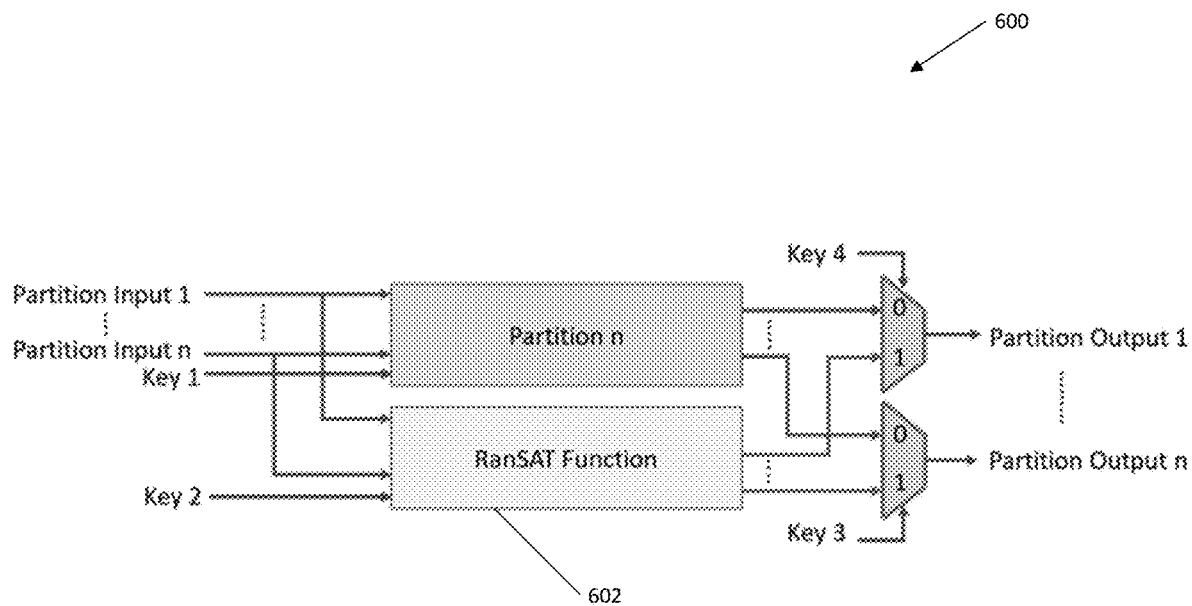
FIG. 6 shows a function generator block included in a partition of a split design, in accordance with one embodiment of the present disclosure.

FIG. 6 shows an exemplary system 600 that includes, in part, a RanSAT function generator 602, added to a partition n of a design. The RanSAT function generator 602 may be used to mimic the original circuit functionality. RanSAT function generator 602 may include the same number of input/output ports, logic level, and/or the number of obfuscation key-bits to form a symmetric shape. It is understood that although the RanSAT function generator 602 is not part of the original circuit design, an SAT attack algorithm must analyze the RanSAT functions in every iteration, thereby exponentially increasing the runtime of the attack. Another advantage of the RanSAT function is that the output corruptibility of the obfuscated design is relatively very high. The corruptibility in conventional SAT-resistant methods has to be reduced to make it difficult to find a DIP and increase the runtime of the attack.

In one embodiment, each partition may be obfuscated by altering the overall functionality. Such an alteration may be performed in the RTL code. As such, the randomness can be maximized while maintaining a robust locking mechanism. Furthermore, any attack that focuses on machine learning training to extract keys (e.g., such as SAIL) can be thwarted. A non-deterministic obfuscation technique, used according to some embodiments of the present disclosure, makes it difficult for an attacker to launch a successful attack.

In some embodiments, a design transformation includes adding a CASE statement—a well-known Verilog coding statement that allows for different conditions to be performed when specific values are observed—to the partition. In one embodiment, the design transformation process obfuscates a number of outputs in each partition. In one embodiment, the physical location of each partition to be obfuscated is selected at random. Moreover, the locking mechanism may also be randomized. For example, in some embodiments, the locking mechanism can be achieved using one or more of XOR, XNOR, two-input multiplexer (mux), four-input mux, and the like. In one embodiment where a mux is used for transformation, the dummy functions can be a random set of gates that employ the same partition inputs as the original circuit. In one embodiment where a mux is selected, the dummy functions can be randomly selected signal lines from the original design such as, for example, internal signals, primary inputs, key inputs, or constants.

Figure 7A:
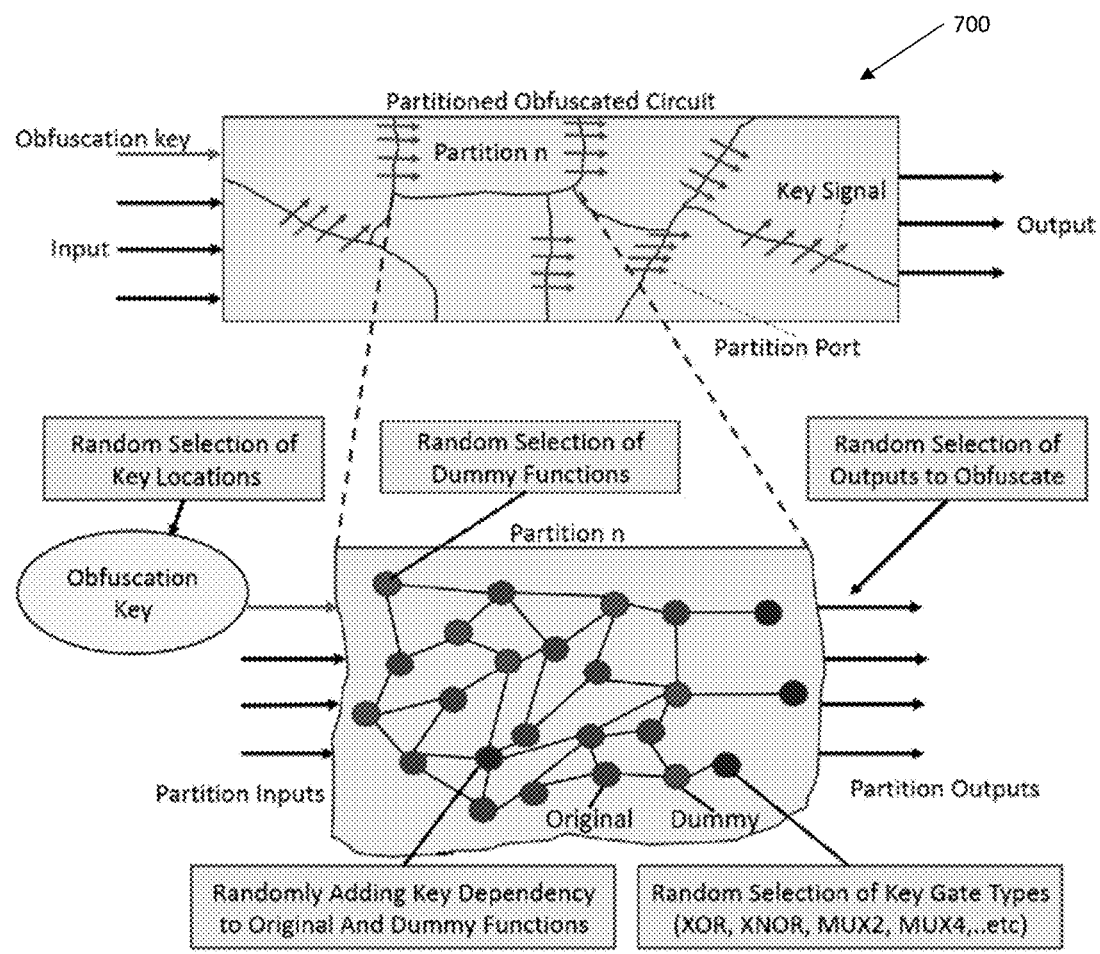
FIG. 7A shows a design transformation process, in accordance with one embodiment of the present disclosure.

FIG. 7A illustrates a design transformation process 700, according to an embodiment of the present disclosure. When, for example, mux-based obfuscation is employed, gates performing dummy functions may be inserted in the partitions. Such dummy functions may include a randomly implemented selected gates and/or connections. In some embodiments, the dummy functions may be close to the functions performed by the original design.

The multiplexer-based obfuscation may by used to alter a graph associated with the original circuit. The selection process of dummy routes can be implemented such that, in each partition, at least one dummy route from another partition in the same logic depth is used, thereby resulting in a grid-like shape between different partitions of the design. In some embodiments, by using dummy functions and/or routes that are not present in the fan-out cone of the selected node for obfuscation, combination loops are avoided. A combination loop can be, for example, a loop that is formed when a combinational logic chain drives itself. As is known, if the output of a set of gates in a chain is connected to the input of the chain, the chain may oscillate, an outcome that is undesirable and inhibited by embodiments of the present disclosure. In one embodiment, to control the key size, the same keys may be used in different partitions. As such, a wrong key used by an attacker can affect multiple nodes resulting in a significant increase in the output corruptibility.

In some embodiments, a design transformation process may be implemented to support a configurable key that enables assigning a unique key for each chip instance. To assign a unique key to each chip instance and for each partition, a one-way function (or other Boolean function) controlled by a key-configuration-variable can be included for key bits associated with a partition. In one embodiment, the one-way function may receive a first input that corresponds to a raw key (e.g., a subset of the obfuscation key) for a given partition and/or a second input that corresponds to the key-configuration-variable. The first input and/or the second input can be used to generate a true key. The true key may be, for example, a correct obfuscation key that unlocks the partition. In one embodiment, the one-way-function enables the raw key to be changeable at different IP development stages by reconfiguring one or more memory elements storing the key-configuration-variable.

Figure 7B:
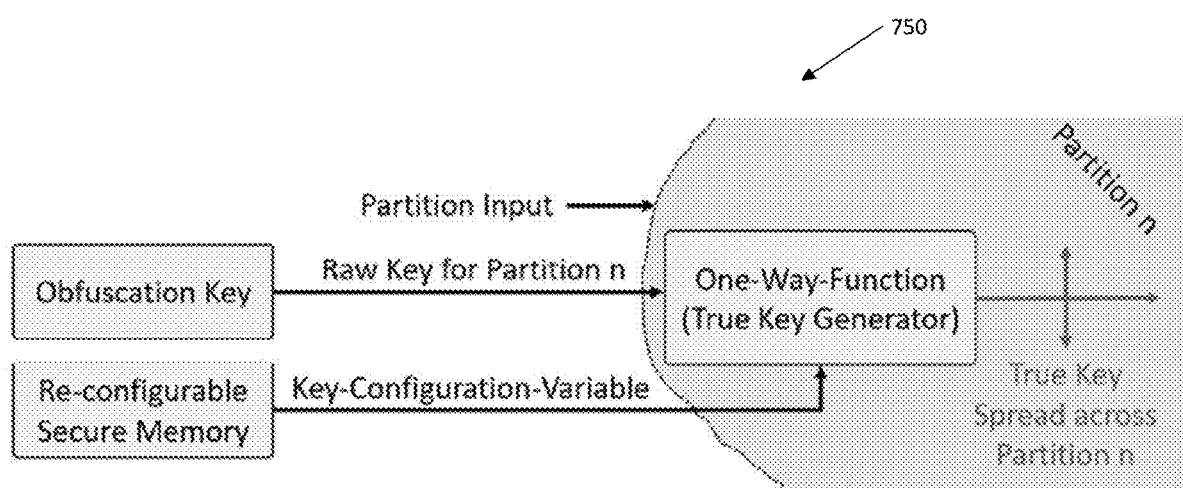
FIG. 7B shows a process for updating a key, in accordance with one embodiment of the present disclosure.

FIG. 7B shows a key-update mechanism 750, in accordance with one embodiment of the present disclosure. A true key for a given partition may be generated using a one-way-function that receives two inputs, namely a raw key for the partition and a key-configuration-variable. Both inputs to the one-way-function that generates the true key may be accessible and/or controlled by the user. For example, in one embodiment, a secure memory module can be integrated to store the raw key and/or the key-configuration-value.

In some embodiments, a random SAT-hard (RanSAT) function generator generates functions, such as RanSAT functions with relatively high SAT complexity. The generated RanSAT functions can be randomized in terms of gate types and/or connections.

Figure 8:
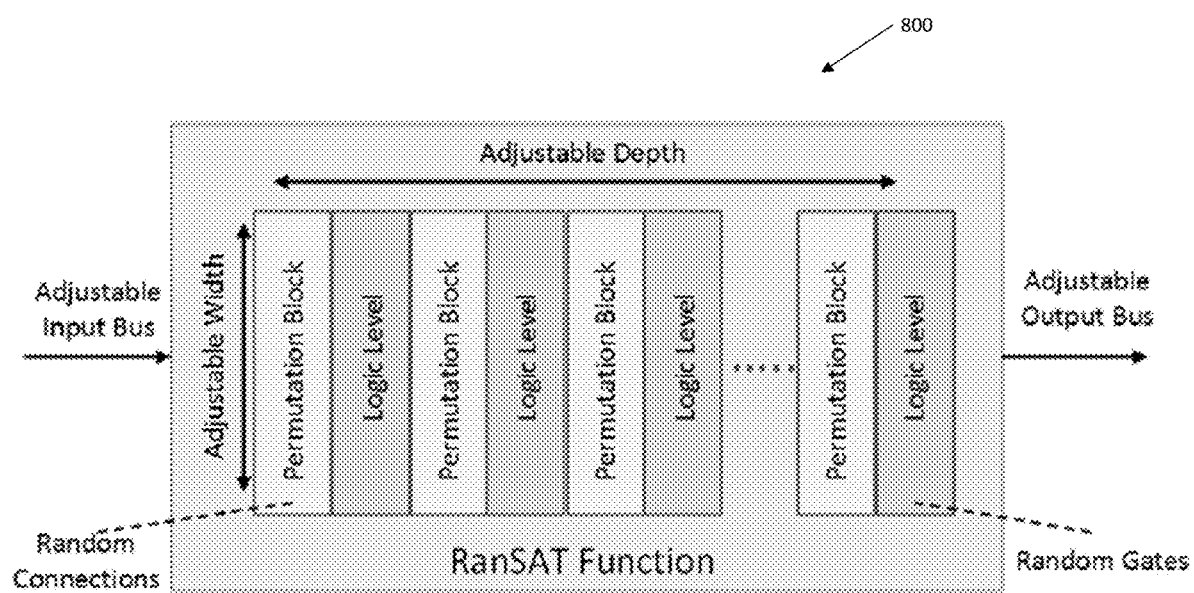
FIG. 8 shows a random SAT function adapted to generate a random function, in accordance with one embodiment of the present disclosure.
Figure 10A:
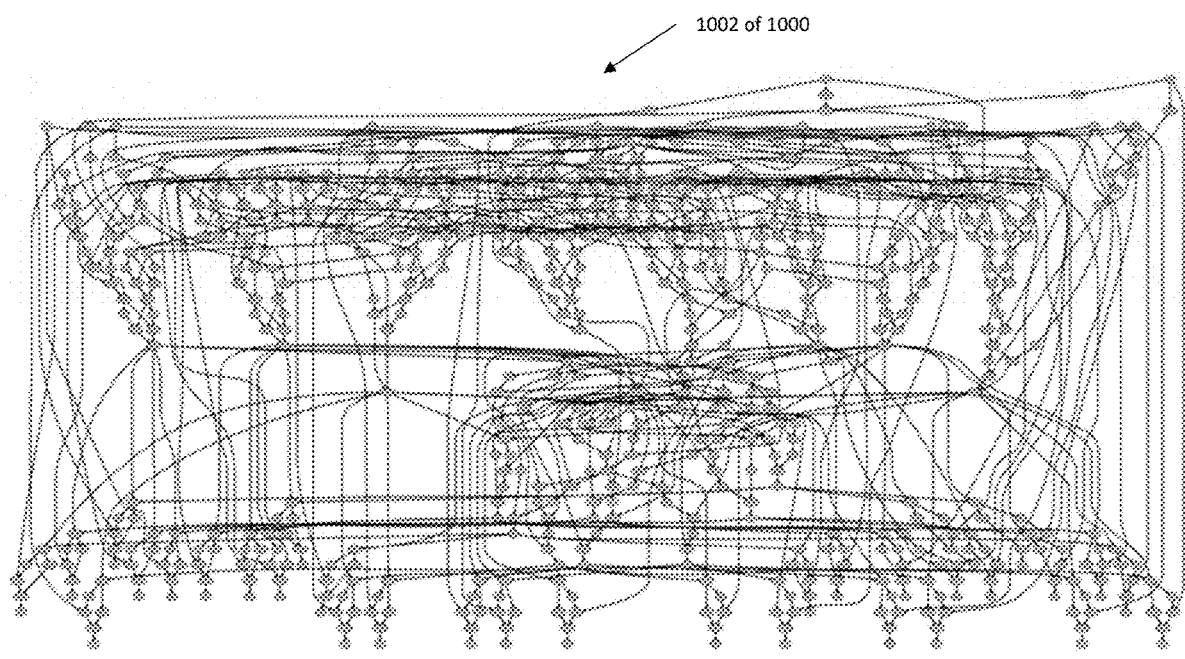
FIGS. 10A, 10B, 10C, 10D, and 10E are a graphical overview that compares a scalable attack-resistant obfuscation process, in accordance with one embodiment of the present disclosure, to a number of conventional locking techniques.
Figure 10B:
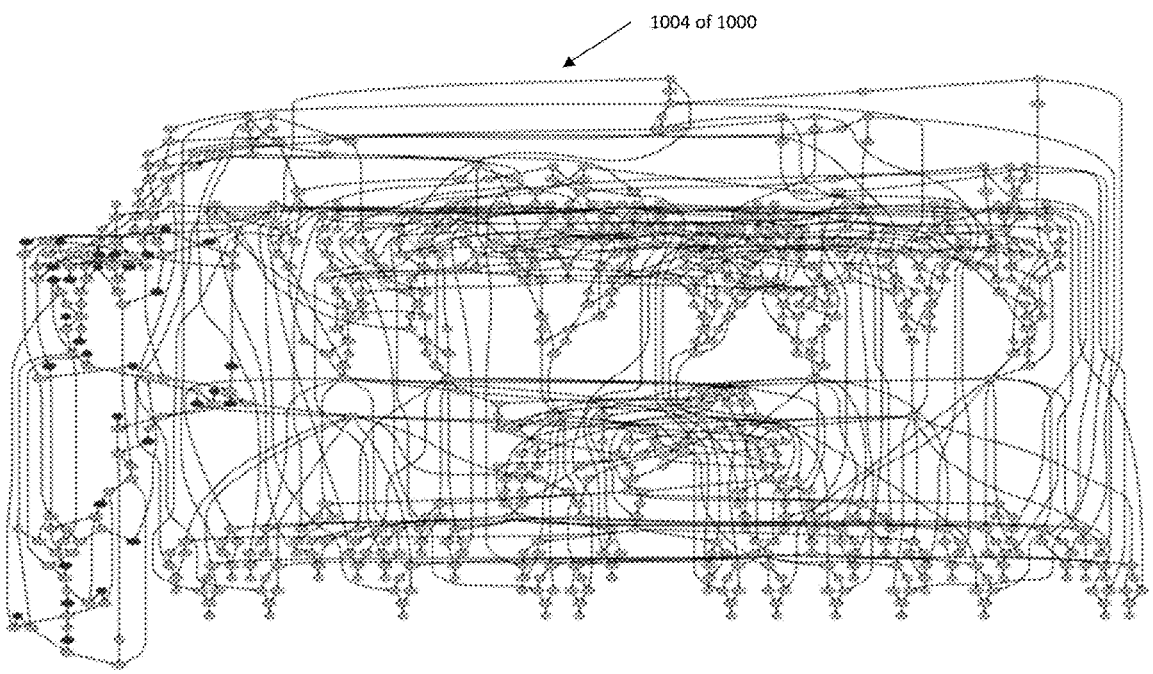
Figure 10C:
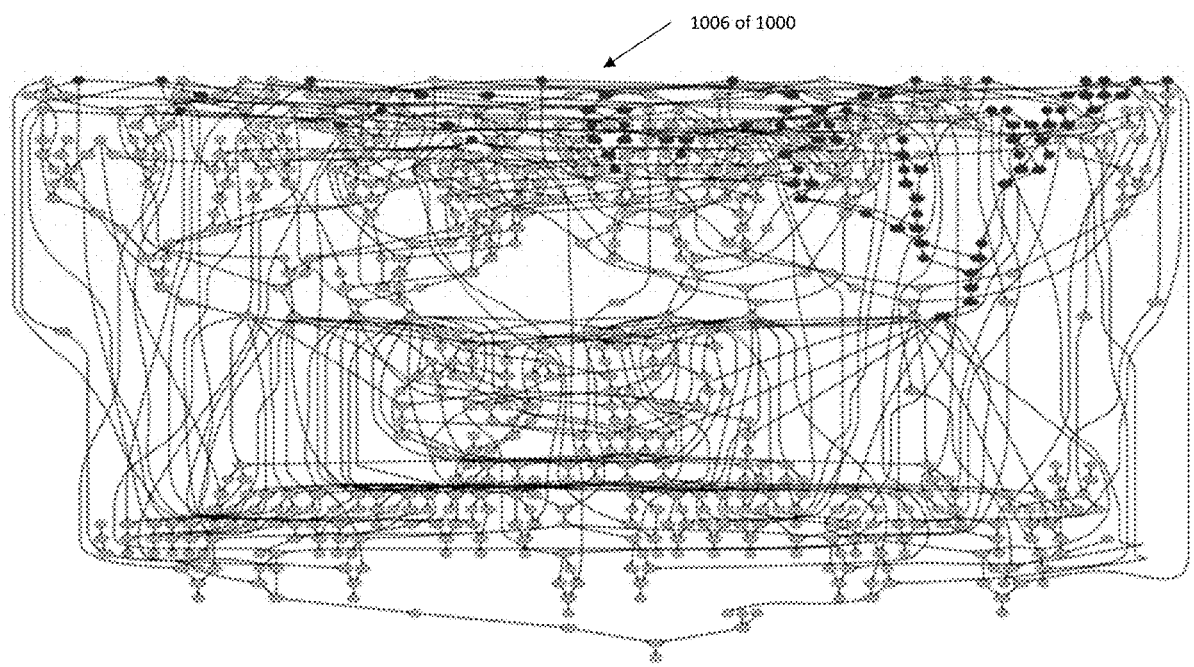
Figure 10D:
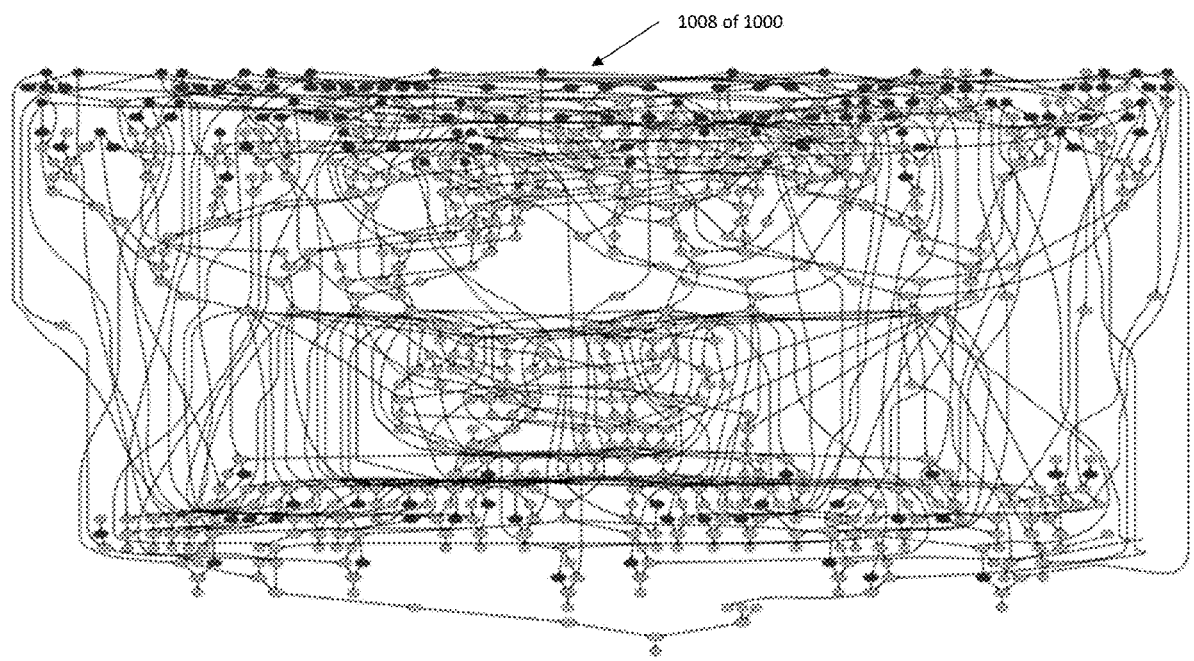
Figure 10E:
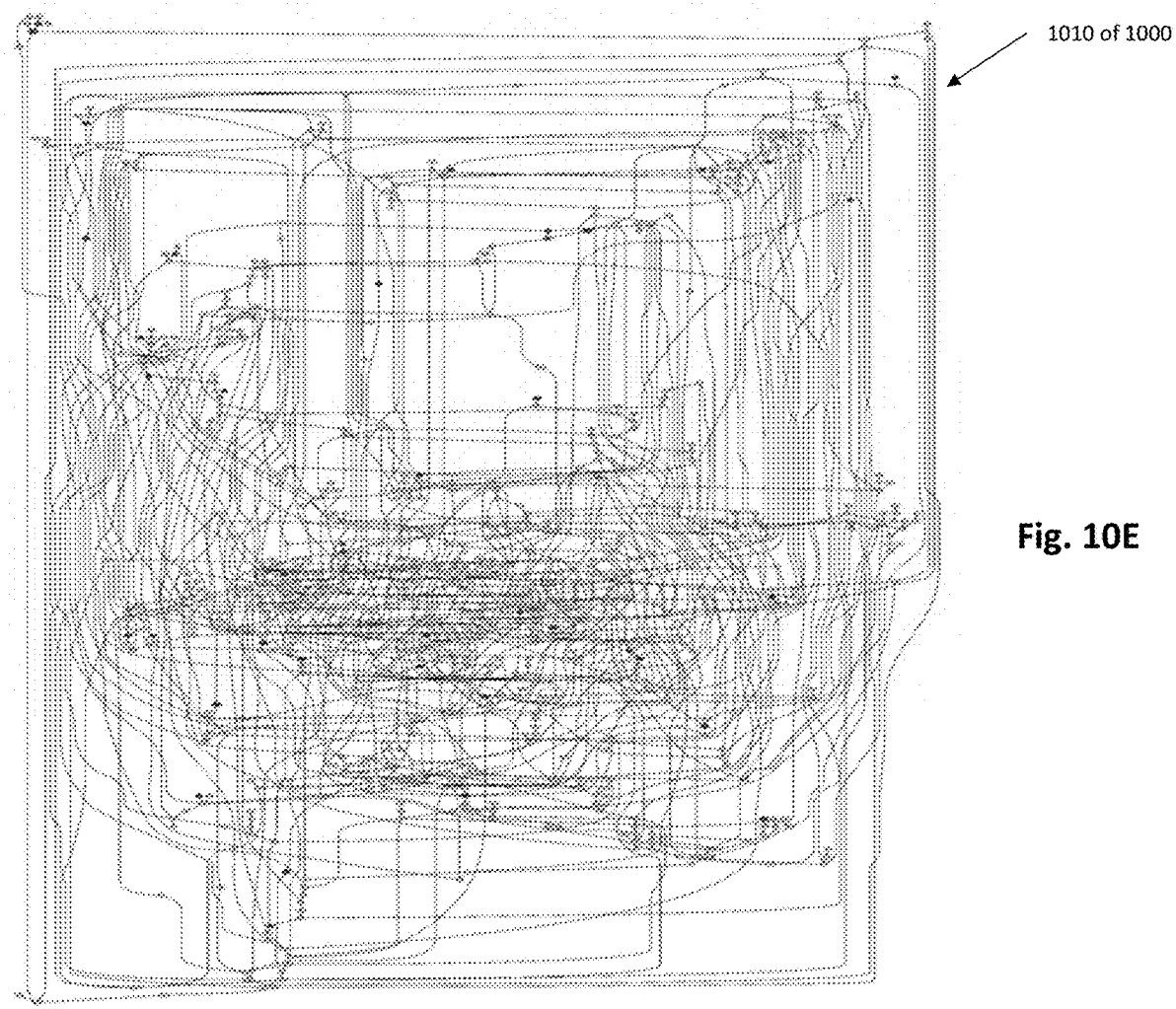

FIG. 8 shows a RanSAT function 800, in accordance with one embodiment of the present disclosure. The RanSAT function 800 includes a number of control features. For example, the RanSAT function 800 can provide control over the size and/or shape of the generated RanSAT functions. Furthermore, the number of inputs and/or outputs can be adjustable to meet one or more design requirements, as provided by a user. Additionally, the number (see parameter $Depth_{RanSAT}$ in the code shown in FIG. 9) and/or the size (see parameter $Width_{RanSAT}$ in the code shown in FIG. 9) of logic levels can also be controlled.

The permutation blocks (see FIG. 8) disposed between logic levels are configured to facilitate random interconnection of gates. The permutation blocks can facilitate selection of gates at least once in each new level so as to, for example, avoid dangling and/or unconnected nodes. Based on the number of outputs, the wires used at the last logic levels can be randomly segmented into groups. In one embodiment, each group can correspond to one output. Furthermore, the wires in each group can be reduced to one wire by applying a multi-input randomly selected gate.

In some embodiments, the RanSAT function 800 may be generated based on a set of rules. Such rules includes, for example, a rule requiring that the RanSAT function 800 match the selected partition in terms of the number of inputs/outputs, or a rule that the number of inserted RanSAT functions should not cause the overall overhead to exceed a certain percentage (e.g., 15%), or a rule requiring that the gate types in each logic levels be balanced to maintain a ratio of 3-SAT CNF clause to a variable between a certain interval (e.g., 3.5 and 5), or a rule requiring that a number of variables be higher than a certain threshold value (e.g., 200 variables), or a rule that all input wires to each permutation block be used at least once, and the like.

FIG. 9 is an exemplary algorithm 900 that provides a RanSAT function generator, in accordance with one embodiment of the present disclosure. Algorithm 900 receives data representing a circuit partition as its input. The partition can be structurally analyzed to compute the number of logic levels and/or the average number of gates per level. Algorithm 900 can vary the number of logic levels and/or the average number of gates per level by adding or subtracting a randomly selected value (e.g., t2) to increase the randomness of the generated function. Each level can be created in a single iteration in the loop, as shown in line 8 of the algorithm 900.

In one embodiment, the level generation process may apply an initial CNF clause to the variable ratio analysis, where variable $CV_{initial}$ is received. Algorithm 900 can control variable CV by adjusting the level width via parameter $Width_{RanSAT}$. In one embodiment, the level width defined by parameter $Width_{RanSAT}$ can control the number of CNF variables added to the function and/or the types of gates inserted to control the number of CNF clauses. For example, certain gate types, such as XOR gates, have more clauses, while other gate types, such as AND gates can be represented with a lower number of clauses.

In one embodiment, the width defined by parameter $Width_{RanSAT}$ and/or types of gates, as obtained from parameter gates list, for parameter $RanSAT_{level}$ can be determined using parameter $CV_{initial}$. Furthermore, the generated RanSAT$_{level}$ can be randomly permuted to the accumulated RanSAT$_{graph}$. Moreover, the CNF clause to variable ratio CV for the updated RanSAT function can be computed. For example, in some embodiments, the newly added level may be accepted if the CV is between, e.g. 3.5 and 5, defined as an optimum range to provide a SAT-complex function. In one embodiment, the generated RanSAT function can be stitched to the original partition, as shown in FIG. 5. The SAT-hard obfuscated partition defined by parameter $Partition_{obf}$ may correspond to the output of the algorithm 900.

In some embodiments, the SAT analysis may be performed with respect to several generated RanSAT functions with different sizes. The results of such analysis is shown in the exemplary Table below:

| Variant | Inputs | Outputs | Gate Count* | Logic Levels (Depth) | Level Size (Width) | SAT Attack Runtime (s) |
|---|---|---|---|---|---|---|
| 1 | 12 | 2 | 234 | 7 | 15 | 41623 |
| 2 | 14 | 2 | 251 | 8 | 20 | 59644 |
| 3 | 16 | 1 | 289 | 9 | 25 | 212806 |
| 4 | 18 | 1 | 311 | 10 | 30 | 230863 |
| 5 | 20 | 2 | 364 | 11 | 35 | 283791 |
| 6 | 22 | 1 | 411 | 12 | 40 | 307718 |

As is seen from the above Table, the generated RanSAT functions provide improved security for a circuit, where runtimes may exceed days for the RanSAT function associated with 289 gates. Additionally, when placing multiple RanSAT functions across the design, the overall SAT complexity for the obfuscated circuit grows, thereby providing improved security for a circuit.

FIGS. 10A, 10B, 10C, 10D, and 10E are a graphical overview 1000 that compares the SARO process disclosed herein to conventional locking techniques. The original design of an integrated circuit is identified as 1002. A stripped-functionality locking result associated with a conventional obfuscation technique for the circuit is identified as 1004. A full locking result associated with another conventional obfuscation technique for the circuit is identified as 1006. A cone-size based locking result associated with another conventional obfuscation technique is identified as 1008. The scalable attack-resistant obfuscation of the circuit achieved using embodiments of the present disclosure are identified as 1010.

As seen in FIGS. 10A, 10B, 10C, 10D, and 10E, all key-gates of the stripped-functionality locking result 1004, the full locking result 1006 and the cone-size based locking result 1008 are clustered in a certain region of the circuit. However, embodiments of the present disclosure perform an obfuscation that distributes the key-gates across the entire design, thereby substantially altering the graphical representation of the locked circuit associated with the original design 1002.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method of obfuscating a circuit design, the method comprising:
   receiving a netlist of the circuit design;
   splitting the circuit design into a plurality of partitions, wherein a size of each of the plurality of partitions is determined based at least in part on a size of the circuit design and a key size for obfuscating the circuit design;
   generating a randomized circuit associated with each of at least a subset of the plurality of partitions, each randomized circuit substantially matching a shape and the size of the associated partition;
   merging each of the at least a subset of the plurality of partitions with the partition's associated randomized circuit via a plurality of multiplexers each adapted to receive a different key at the multiplexer's select terminal;
   transforming each of the plurality of partitions thereby to obfuscate each partition; and
   stitching the plurality of transformed partitions to form the obfuscated circuit design.

2. The method of claim 1 further comprising:
   shuffling the transformed partitions.

3. The method of claim 1 wherein said netlist is a register transfer level netlist.

4. The method of claim 1 further comprising:
   varying a number of the plurality of partitions.

5. The method of claim 1 further comprising:
   varying the size of at least a subset of the plurality of partitions.

6. The method of claim 1 wherein the plurality of partitions are distributed throughout an entirety of the design.

7. The method of claim 1 further comprising:
   quantifying an amount of transformation associated with each partition.

8. The method of claim 1 further comprising:
   randomizing a number of outputs obfuscated in each partition.

9. The method of claim 1 further comprising:
   randomizing a location in each partition at which an obfuscation key is applied.

10. The method of claim 1 further comprising:
    randomly selecting in each partition one or more logic gates used to obfuscate the partition.

11. The method of claim 1 further comprising:
    adding a first key to at least one of the obfuscated partitions; and
    adding a second key to the partition's associated randomized circuit.

12. The method of claim 11 further comprising:
    including configurable logic to enable updating of the first and second keys during various stages of development of the design.

13. A system comprising:
    a memory storing instructions; and
    a processor, coupled with the memory and configured to execute the instructions, the instructions when executed causing the processor to:
    receive a netlist of the circuit design;
    split the circuit design into a plurality of partitions, wherein a partition size of each of the plurality of partitions is determined based at least in part on a size of the circuit design and a key size for obfuscating the circuit design;
    generating a randomized circuit associated with each of at least a subset of the plurality of partitions, each randomized circuit substantially matching a shape and the size of the associated partition;
    merging each of the at least a subset of the plurality of partitions with the partition's associated randomized circuit via a plurality of multiplexers each adapted to receive a different key at the multiplexer's select terminal;
    transform each of the plurality of partition thereby to obfuscate each partition; and
    stitch the plurality of transformed partitions to form the obfuscated circuit.

14. The system of claim 13 wherein the instructions further cause the processor to shuffle the transformed partitions.

15. The system of claim 13 wherein said netlist is a register transfer level netlist.

16. The system of claim 13 wherein the instructions further cause the processor to vary a number of the plurality of partitions.

17. The system of claim 13 wherein the instructions further cause the processor to vary the size of at least a subset of the plurality of partitions.

18. The system of claim 13 wherein the plurality of partitions are distributed throughout an entirety of the design.

19. The system of claim 13 wherein the instructions further cause the processor to quantify an amount of transformation associated with each partition.

20. The system of claim 13 wherein the instructions further cause the processor to randomize a number of outputs obfuscated in each partition.

21. The system of claim 13 wherein the instructions further cause the processor to randomize a location in each partition at which an obfuscation key is applied.

22. The system of claim 13 wherein the instructions further cause the processor to randomly select in each partition one or more logic gates used to obfuscate the partition.

23. The system of claim 13 wherein the instructions further cause the processor to:
    add a first key to at least one of the obfuscated partitions; and
    add a second key to the partition's associated randomized circuit.

24. The system of claim 19 wherein the instructions further cause the processor to:
    include configurable logic to enable updating of the first and second keys during various stages of development of the design.

* * * * *

UNITED STATES PATENT AND TRADEMARK OFFICE
CERTIFICATE OF CORRECTION

PATENT NO. : 11,797,736 B2
APPLICATION NO. : 17/443815
DATED : October 24, 2023
INVENTOR(S) : Bhunia et al.

It is certified that error appears in the above-identified patent and that said Letters Patent is hereby corrected as shown below:

In the Claims

<u>Column 12,</u>
Line 55, in Claim 24, "claim 19" should read --claim 23--.

Signed and Sealed this
Eighth Day of October, 2024

Katherine Kelly Vidal
*Director of the United States Patent and Trademark Office*